United States Patent [19]

Wilkinson

[11] Patent Number: 4,532,636
[45] Date of Patent: Jul. 30, 1985

[54] RADIO COMMUNICATIONS RECEIVERS

[75] Inventor: Dent P. Wilkinson, Hampshire, England

[73] Assignee: The Marconi Company Limited, England

[21] Appl. No.: 389,905

[22] Filed: Jun. 18, 1982

[30] Foreign Application Priority Data

Jun. 22, 1981 [GB] United Kingdom ................. 8119215

[51] Int. Cl.³ ............................................... H04B 1/10
[52] U.S. Cl. ........................................ 375/1; 375/104;
455/304; 455/312
[58] Field of Search ...................... 360/38.1, 41; 375/1,
375/102, 104; 371/31, 65, 69; 455/303, 304,
312; 358/314

[56] References Cited

U.S. PATENT DOCUMENTS

| | | | |
|---|---|---|---|
| 2,996,576 | 8/1961 | Dolby | 360/38.1 |
| 3,347,984 | 10/1967 | Holmberg | 360/38.1 |
| 3,688,039 | 8/1972 | Ishiguro | 371/31 |
| 3,700,812 | 10/1972 | Springett | 455/312 |
| 3,824,620 | 7/1974 | Langer | 360/38.1 |
| 3,947,636 | 3/1976 | Edgar | 328/163 |
| 4,291,405 | 9/1981 | Jayant et al. | 371/31 |
| 4,376,289 | 3/1983 | Reitmeier et al. | 360/38.1 |
| 4,398,296 | 9/1983 | Gott et al. | 375/1 |

FOREIGN PATENT DOCUMENTS 2916127 11/1979 Fed. Rep. of Germany .
2297524 8/1976 France .

Primary Examiner—Benedict V. Safourek
Attorney, Agent, or Firm—Kirschstein, Kirschstein, Ottinger & Israel

[57] ABSTRACT

In radio communications receivers for use on frequency hopping radio communications networks, the received signal in each hop period is analyzed and assigned a quality value. If more than one signal is present during the hop period it is determined that more than one network has changed to the same frequency. Similarly if the received signal is out of synchronism it is determined that more than one network has changed to the same frequency. When more than one network has changed to the same frequency, the received signal is not output by the receiver but is replaced by an earlier (or later) received signal.

8 Claims, 4 Drawing Figures

RADIO COMMUNICATIONS RECEIVERS

The present invention relates to radio communications receivers and in particular to such receivers for use in frequency hopping radio communications networks.

One technique of overcoming deliberately introduced radio interference signals (jamming) in a radio communications network is to change the frequency on which the transmitters and receivers operate at periodic intervals. When such frequency changes occur at periodic intervals of the order of milliseconds with each frequency change occurring by the transmitter and receiver in synchronism with each other the technique provides some confidentiality to the transmissions as well as some immunity to jamming. This method of operation is referred to herein as "frequency hopping".

When frequency hopping communications networks are in use with several groups of radio sets using a similar set of frequency channels interference between groups of sets hopping in pseudo random fashion may occur due to two of the groups hopping to the same channel simultaneously. Such frequency coincidences will usually generate an interference burst of one "hop" period. When the network is being used for voice communication with a hop period of, say, a few milliseconds the interference bursts are characterised by a noise background of apparent clicks superimposed on a voice message. As the number of groups of radio sets using the frequency channels available increases the probability of two or more groups selecting the same channel increases and consequently the intelligibility of voice communications in the networks decreases.

In practical tests it has been determined that if 25% or greater obliteration of the voice signal waveform occurs the voice communication is no longer intelligible. Without special processing of the voice signal the intelligibility limit is reached when approximately N/3 groups of radio sets are independantly hopping between the same N frequency channels.

It is an object of the present invention to provide radio communications apparatus in which the tolerable level of signal obliteration is increased.

According to the present invention a radio communication receiver for use in a frequency hopping radio communication network comprises store means to store a representation of a received signal for a period of T2; selection means which is responsive to a control signal selectively to output either a currently received signal, or the stored representation from said store means of a received signal received T2 earlier; and signal quality measurement means which determines from at least one characteristic of the received signal in each of a succession of said periods T1 within those periods, whether the received signal comprises more than one transmitted signal and, if so, forwards said control signal to said selection means such that, for any of the periods T1 in which the received signal has a low signal quality value, an alternative signal is output by the receiver.

Preferably the period of T2 is in the range of eight to ten milliseconds and the means to store is a delay line.

The received signal may be delayed by a period of T1 before being selected for output and for storage by the delay line.

In a preferred embodiment the received signal is stored in a delay line having a plurality of tappings at intervals of T2 and the tapping having the highest of said signal quality values is selected as the output signal if the received signal quality value is less than a predetermined value.

The received signal may be delayed by an additional period of multiples of T2 so that a later received signal may be selected as the output signal if the quality values so require.

Radio communications apparatus in accordance with the invention will now be described with reference to the accompanying drawings of which:

FIG. 4 is a block schematic diagram of a quality assessment circuit used in the processing circuits of FIGS. 2 and 3.

It will be appreciated that speech waveforms comprise a basic frequency on which a number of harmonics are superimposed. The average pitch period of the basic frequency of an adult male speaker has been determined to be in the range from eight to ten milliseconds.

It is convenient to note that frequency hopping radio communications apparatus may change frequency (hop) at intervals of less than the average pitch period previously referred to.

For the avoidance of doubt it is noted that the period between each change of frequency is referred to hereinafter as a "hop period".

For the purpose of description the signal arriving at a radio receiver in a hop period in which two or more radio communications sets are transmitting on the same frequency is referred to hereinafter as a "corrupt hop". Similarly the signal arriving at a radio receiver in a hop period in which only an associated group of radio communications sets have switched to the channel is referred to as a "valid hop".

Figure 1:
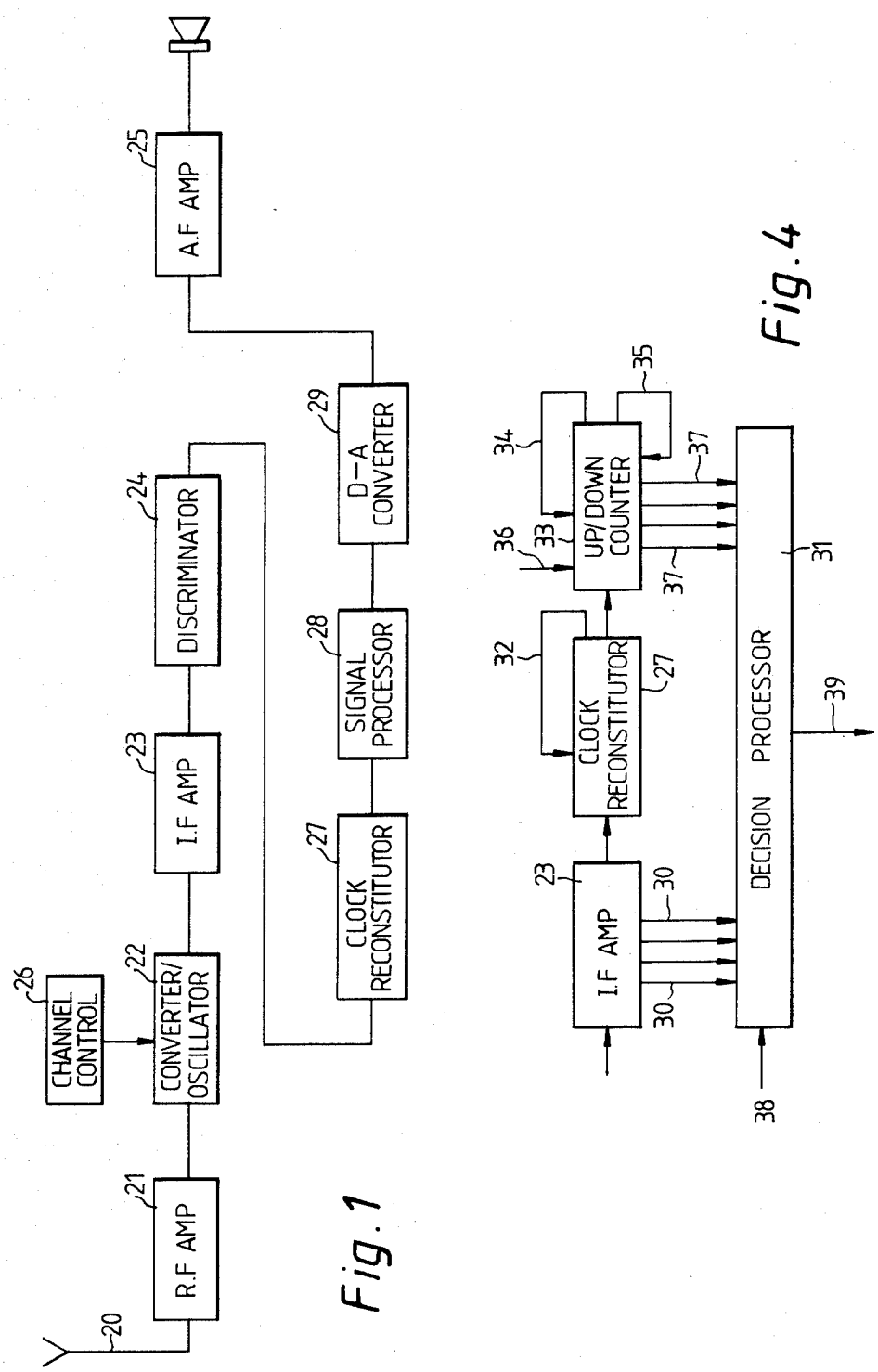
FIG. 1 is a block schematic diagram of a frequency hopping radio receiver.

Referring to FIG. 1 radio signals received at an aerial 20 of the typical frequency hopping receiver are amplified by a radio frequency amplifier 21 and the selected radio signal is converted to an intermediate frequency by mixing in a converter/oscillator 22. The intermediate frequency signal is amplified by an intermediate frequency amplifier 23 before being applied to a discriminator 24 and an audio amplifier 25.

As the frequency of the wanted signal from the aerial 20 changes (hops) at periodic intervals a channel control circuit 26 causes the frequency of the oscillator 22 to change in a pseudo-random manner in synchronism with channel changes of the transmitted signal. A channel control circuit suitable for use as the channel control circuit is described in co-pending patent applicaton Ser. No. 386,296 filed June 8, 1982.

Since in the present system the received signals represent digitally encoded speech signals a clock reconstitutor circuit 27 is used to extract the digital data which is then stored in a signal processing circuit 28. Digital data selected by the circuit 28 as hereinafter described is converted to analogue form by a digital to analogue converter 29 before amplification by the amplifier 25.

Figure 2:
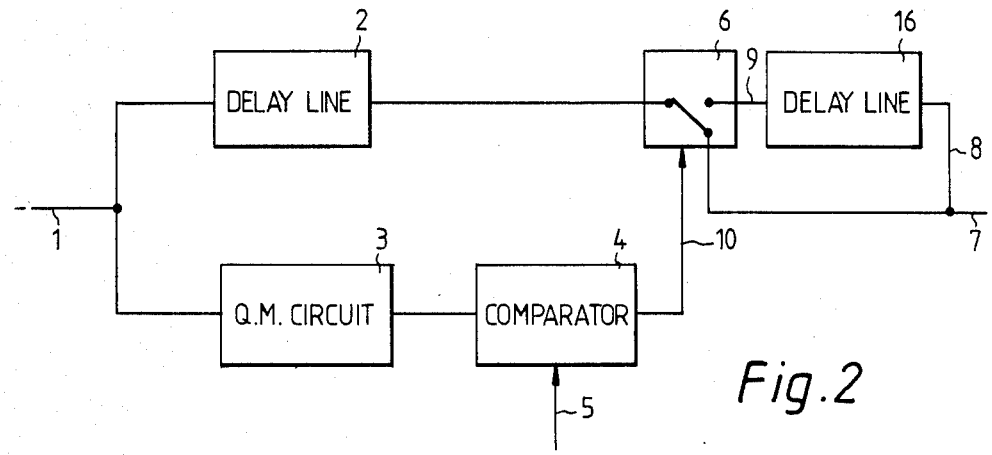
FIG. 2 is a block diagram of a signal processing circuit for use in the apparatus.

Referring now to FIG. 2 a digital signal received by the radio communications set is demodulated and fed to an input 1 of the signal processing circuit 28 (of FIG. 1). The signal is delayed in a delay line 2 for a period of T1 which is one hop period. A quality measurement circuit 3 determines from the strength and synchronisation of the received signal on the lead 1 a value representing the average quality of the signal received in the immediately preceding period T1.

The quality measurement value determined by the quality measurement circuit 3 is compared by a comparator 4 with a threshold signal supplied on a connection 5. If the quality value exceeds the threshold signal value the signal from the delay line 2 is switched through an electronic changeover circuit 6 to an output line 7 which is connected to the digital to analogue converter 29 (of FIG. 1).

If the quality value does not exceed the threshold signal value the comparator 4 provides a signal on lead 10 to cause the changeover circuit 6 to switch to pass a previously received signal to be fed from a lead 9 from a second delay line 16 to the output line 7 until the average quality of the signal determined by the quality measurement circuit 3 again exceeds the threshold.

The delay line 16 is fed from the output line 7 by a line 8 and introduces a delay "T2" of from eight to ten milliseconds, the average male pitch period between its input on the lead 8 to its output on the lead 9.

Thus the signal processing circuit of FIG. 1 is arranged to replace any corrupt hop, as detected by the quality measurement circuit 3, with a previously received valid hop. The valid hop replacing a corrupt hop is one received a period of "T2" earlier, the delay being introduced by the delay line 16.

It has been determined that if T2 is close to the "hop" period causing each corrupt hop to be replaced by an immediately preceding valid hop signal obliteration of up to 40% may be achieved before the received signal becomes unitelligible. However, if T2 is close to the hop period the voice output of the apparatus taken on an unnatural sounding monotonic pitch since the voice pitch tends to be replaced by the pitch of the hop frequency.

By arranging T2 to be close to the natural pitch the correct fill-in waveform is provided approximately 90% of the time due to the nature of speech waveforms. Although pitch tracking may improve the voice output it has been found that arranging "T2" to be of the order of eight to ten milliseconds provides a natural sounding output from the radio receiver.

Figure 3:
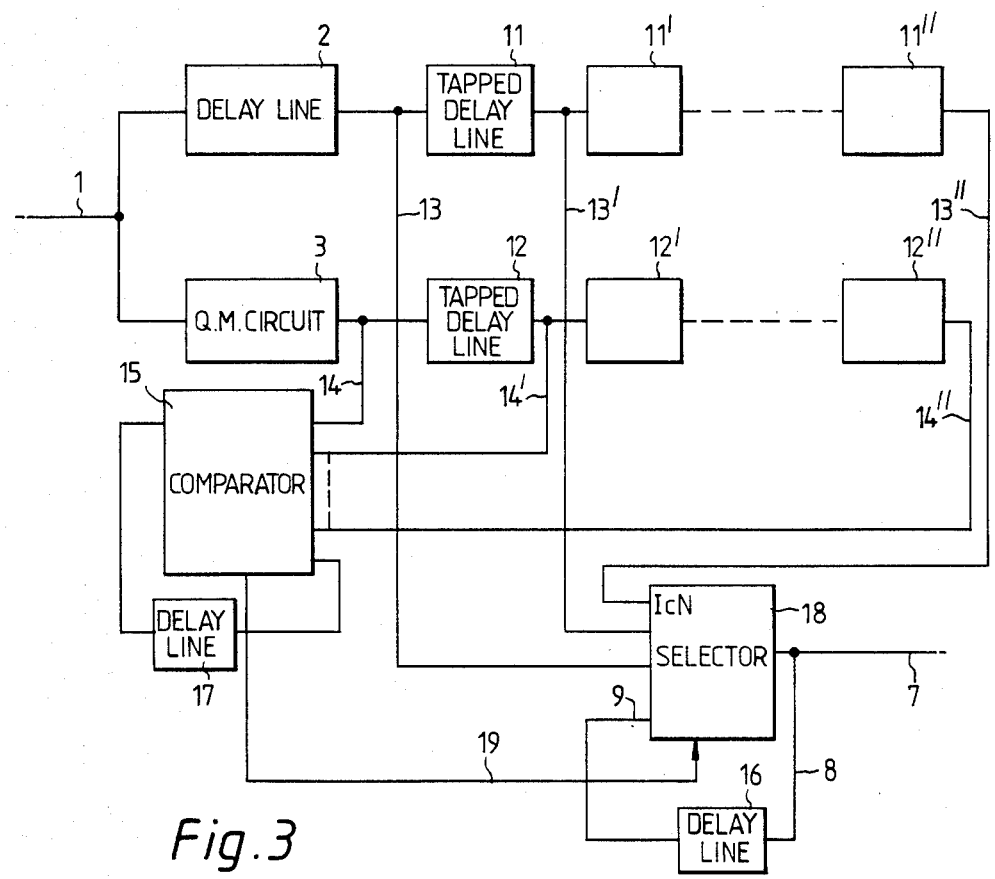
FIG. 3 is a block diagram of an alternative form of signal processing circuit for use in the apparatus.

The signal processing circuit of FIG. 3 to which reference is now made is arranged to extend the technique of replacing corrupt hops with a previously received valid hop to either a previously received or later received valid hop.

The signal from the delay line 2 is fed to a tapped delay line shown as a number of individual delays 11, 11' to 11" and the accompanying quality value from the quality measurement circuit 3 is fed to a respective tapped delay line 12, 12' to 12". Each delay period of the tapped delay lines 11, 11' to 11" and 12, 12' to 12" is of length "T2" which is preferably eight to ten milliseconds.

The quality value from each output of the delay line 12, 12' to 12" is fed to a quality comparison device 15 which determines by "weighting" the quality value of each of the previously received signal segments stored in the delay line 11, 11' to 11" and each subsequently received signal segment against the value of the signal segment which is due to be output (the current signal segment). If the quality value of the current signal segment is acceptable the comparison device 15 causes a one out of n selector 18 to output the current signal segment to the line 7.

If the current signal segment is corrupt the comparison device causes the signal segment previously received or the signal segment next received to be output by the one-out-of-n selector 18 on the lead 7 in dependence upon their respective quality values as determined by the quality measurement circuit 3. If both the previously received and next received signal segments are also corrupt, the next nearest signal segment is selected for output if its quality is acceptable.

Two further delay lines 16 and 17 are provided each having a delay of "T2". The delay line 16 is arranged to store the signal segment last output to the lead 7 whilst the delay line 17 stores its respective quality value. Thus if none of the signal segments stored in the delay line 11, 11' to 11" has an acceptable quality value the signal segment output to the line 7 a period of "T2" milliseconds previously is repeated.

The value of the delay "T2" introduced by the delay lines 11, 11', to 11", 12, 12' to 12", 16 and 17 is preferably in the range of eight to ten milliseconds if the apparatus is for use by male persons.

The quality comparison device 15 may be made up of analogue or digital voltage comparators or may be implemented by use of a micro-processor.

In an analogue measuring technique used by the quality measurement circuit 15, since it is known that the variation in loss on the propagation path between differing frequencies remains within a predictcable range, say, plus or minus six decibels about an average, any increase of the received signal strength above six decibels (dB) indicates that another unwanted signal is present. Thus any hop in which such an increase occurs is determined as a corrupt hop and the output signal is derived from a valid hop as hereinbefore described.

Another method of utilising signal strength to determine whether the received hop is a corrupt hop or a valid hop is to utilize the signal strength distribution of a wanted signal. In such a method the quality measurement circuit 15 is arranged either to accummulate the signal strength distribution or to assume a signal strength distribution. By comparing the accumulated or assumed signal strength distribution for a hop with the average value of the signal strength of a received hop a probability value of the received hop may be deduced.

The probability value of the received hop is then compared with a probability threshold and if the probability value does not exceed the threshold, the hop is determined to be a corrupt hop and is replaced by a valid hop as hereinbefore described.

Whilst the above methods are adequate when two or more transmitters in different networks are transmitting at the same time it is possible that two or more networks may have changed to the same frequency together and at that time only one transmitter or one of the networks is in use.

The network in which that transmitter is working is, of course, unaffected but the other networks may receive a perceivable click as the signal would be identified as a valid hop.

Thus the signal strength quality measurement is augmented by a digital comparison.

It will be appreciated that a digital transmission has a certain regularity in the transitions from one binary value to the other. Thus from a received transmission a clock reconstitutor may generate a clock signal which is in synchronism with the data transitions. This clock signal is more usually used to determine the optimum time at which to sample the incoming signal to determine the respective value of each data bit.

The clock reconstitutor makes only small phase corrections of the clock signal over a relatively long averaging period so that it is immune to noise or interference in the signal.

Using the clock signal it is possible to assign to each received bit quality designations of valid or corrupt and late or early. Data bits received in synchronism with the clock signal (which will have been synchronised to the digital signal over a period of time) are valid. If the period between pulses of the clock signal is designated as the bit period then data bits received within a quarter of the bit period either side of the clock signal are designated valid, early or valid, late. Similarly data bits received between a quarter of the bit period and one-half of the bit period either side of the clock signals may be determined as corrupt, early or corrupt, late.

The early and late decisions may be used to apply small corrections to the phase of the clock signal to synchronise the clock reconstitutor over a period of time.

The valid and corrupt decisions are used to determine whether the hop is a valid hop of a corrupt hop. The "valid" decisions are used to cause a counter to count up one each time a nominally valid data bit is received whilst the "corrupt" decisions are used to cause the counter to count down one each time a nominally corrupt data bit is received. The value of the count at the end of a hop period provides a measure of the quality value of the hop.

It will be appreciated that when a wanted and an unwanted signal are present at similar signal strengths corrupt hops are determined by the digital discrimination in the quality measurement circuit 15 whilst when more than one signal is present and affecting the signal strength corrupt hops are distinguished by threshold discrimination.

Referring to FIG. 4 the intermediate frequency amplifier is arranged to provide a digital signal on a number of leads 30 to a decision processor (for example a microprocessor) 31. In the clock reconstitutor 27 the late/early, and valid/corrupt decisions are made. Any late or early decision is fed back to the clock reconstitutor 27 on a lead 32 to cause the adjustment of the clock as previously described. The valid and corrupt decisions are passed to a counter 33 which counts up for a valid decision and down for a corrupt decision. If a counter overflow is reached it is fed back on a lead 34 to cause the counter 33 to preset to its maximum value. Similarly if a counter underflow is reached the counter 33 is preset to its minimum value over a lead 35.

A down biassing count may be applied on a lead 36 to cause the counter to count down to its minimum value in the presence of a pure noise signal.

The count reached by the counter 33 is passed to the processor 31 which also receives signals on a lead 38 indicating each occurrence of a frequency change (hop).

The count reached on the current hop is compared with the count reached on the previous hop by the processor 31 to determine the digital quality value of the signal in the hop period. The processor 31 also determines an analogue quality value from the signal strength indicated on the leads 30 and uses a combination of the two values to determine the quality value to be assigned to the hop.

If the quality value indicates a valid hop a signal is provided at the output 39 of the processor 31 to cause the signal to be used at the appropriate time. However, if the quality value indicates a corrupt hop the output signal from the processor 31 will indicate which previously or subsequently received signal is to be used in lieu of the currently received signal.

I claim:

1. A frequency hopping radio communication receiver which has a hop period of T1 and comprising
   (A) store means to store a representation of a received signal for a period of T2;
   (B) selection means which is responsive to a control signal selectively to output either
      (i) a currently received signal or
      (ii) the stored representation from said store means of a received signal received T2 earlier; and
   (C) signal quality measurement means which determines from at least one characteristic of the received signal in each of a succession of said periods T1 within those periods, whether the received signal comprises more than one transmitted signal and, if so, generates and forwards said control signal to said selection means such that, for any of the periods T1 in which the received signal comprises more than one transmitted signal, the stored representation from said store of an earlier received signal is output by the receiver.

2. A radio communication receiver as claimed in claim 1 in which T2 is in the range of eight to ten milliseconds.

3. A radio communication receiver as claimed in claim 1 in which the store means is a delay line.

4. A radio communication receiver as claimed in claim 1, in which means is also provided to delay a received signal for a period of duration T1 to enable an average value of the quality of a received signal in that period to be used to determine which representation of the signal is output by the receiver.

5. A radio communication receiver as claimed in claim 1 in which a tapped delay line having a plurality of taps at intervals corresponding to T2 constitute said store means and the selection means, in addition to selecting as aforesaid either the currently received signal or the stored representation of a received signal received T2 earlier, alternatively selects from a tap on said delay line the stored representation of a received signal received an integral multiple of T2 earlier.

6. A radio communication receiver as claimed in claim 1 in which the quality measurement means determines the presence of more than one transmitted signal in the received signal from the average value of the signal strength in each of the intervals of duration T1.

7. A radio communication receiver as claimed in claim 1 in which the quality measurement means determines the presence of more than one transmitted signal in the received signal for each of the intervals of duration T1 in dependence on a comparison of the arrival time of each data digit defined by the signal with a clock signal synchronized to the expected arrival time of each data digit in a wanted signal.

8. A radio communication receiver as claimed in claim 7 in which the quality measurement means also determines the presence of more than one transmitted signal in the received signal in dependence on average value of the signal strength in each of the intervals of duration T1.

* * * * *